United States Patent
Zheng et al.

(10) Patent No.: US 12,128,936 B1
(45) Date of Patent: Oct. 29, 2024

(54) FAULT DETECTION DEVICE AND METHOD FOR SUPERCONDUCTING ELECTRODYNAMIC MAGNETIC LEVITATION (MAGLEV) TRACK

(71) Applicant: SOUTHWEST JIAOTONG UNIVERSITY, Chengdu (CN)

(72) Inventors: Jun Zheng, Chengdu (CN); Mingming Li, Chengdu (CN); Sanchun Nie, Chengdu (CN); Hao Lu, Chengdu (CN)

(73) Assignee: SOUTHWEST JIAOTONG UNIVERSITY, Chengdu (CN)

( * ) Notice: Subject to any disclaimer, the term of this patent is extended or adjusted under 35 U.S.C. 154(b) by 0 days.

(21) Appl. No.: 18/777,170

(22) Filed: Jul. 18, 2024

Related U.S. Application Data

(63) Continuation of application No. PCT/CN2024/094210, filed on May 20, 2024.

(51) Int. Cl.
  *G01R 29/08* (2006.01)
  *B61B 13/08* (2006.01)
  (Continued)

(52) U.S. Cl.
  CPC ............... *B61K 9/08* (2013.01); *B61B 13/08* (2013.01); *G01R 1/16* (2013.01); *G01R 29/0807* (2013.01); *G01R 33/038* (2013.01)

(58) Field of Classification Search
  CPC .. B61K 9/08; B61B 13/08; G01R 1/16; G01R 29/0807; G01R 33/038
  (Continued)

(56) References Cited

U.S. PATENT DOCUMENTS

| | | | |
|---|---|---|---|
| 5,511,488 A | * | 4/1996 | Powell .................... B61B 13/08 104/285 |
| 5,732,636 A | | 3/1998 | Wang et al. |

(Continued)

FOREIGN PATENT DOCUMENTS

| | | |
|---|---|---|
| CN | 105264389 A | 1/2016 |
| CN | 105803872 A | 7/2016 |

(Continued)

OTHER PUBLICATIONS

Xu, Xiaozhuo, et al. "Pole optimization and thrust ripple suppression of new Halbach consequent-pole PMLSM for ropeless elevator propulsion." IEEE Access 8 (2020): 62042-62052. (Year: 2020).*

(Continued)

*Primary Examiner* — Christopher P McAndrew

(57) ABSTRACT

A fault detection device for a superconducting electrodynamic maglev track includes a frame system and a detection system. The frame system is provided between two sidewall discrete figure-8-shaped coil tracks, and is provided with a signal processing device. The detection system is provided on each side of the frame system, and includes a lifting device and a clamping device. The lifting device is configured to adjust a vertical height of the clamping device. The clamping device is provided at an outer side of the lifting device, and is provided with a first connection portion and a second connection portion, which are respectively connected to a permanent magnet array and a receiving coil. The second connection portion is provided at periphery of the first connection portion. The receiving coil is electrically connected to the signal processing device. A fault detection method is further provided.

7 Claims, 13 Drawing Sheets

(51) Int. Cl.
*B61K 9/08* (2006.01)
*G01R 1/16* (2006.01)
*G01R 33/038* (2006.01)

(58) Field of Classification Search
USPC .......................................................... 324/259
See application file for complete search history.

(56) References Cited

U.S. PATENT DOCUMENTS

| | | | | |
|---|---|---|---|---|
| 6,101,952 | A * | 8/2000 | Thornton | B60L 13/003 104/130.02 |
| 6,129,025 | A * | 10/2000 | Minakami | B60L 13/03 104/88.01 |
| 6,357,359 | B1 * | 3/2002 | Davey | B60L 13/10 104/282 |
| 9,126,487 | B2 * | 9/2015 | Henderson | H02N 15/00 |
| 9,511,959 | B2 * | 12/2016 | Bambrogan | E01B 25/00 |
| 2003/0005851 | A1 * | 1/2003 | Post | F16C 39/063 104/281 |
| 2007/0089636 | A1 * | 4/2007 | Guardo | B60L 13/10 104/281 |
| 2010/0212537 | A1 * | 8/2010 | Borowy | B60L 13/06 104/284 |
| 2013/0193276 | A1 * | 8/2013 | Hunter | B61L 25/025 342/385 |
| 2018/0141459 | A1 * | 5/2018 | Henderson | B61B 13/10 |
| 2018/0223481 | A1 * | 8/2018 | Dunham | B61B 13/08 |
| 2018/0237996 | A1 * | 8/2018 | Sadeghi | E01B 25/305 |
| 2018/0299520 | A1 * | 10/2018 | Piron | A61B 5/055 |
| 2019/0100389 | A1 * | 4/2019 | Neubauer | H02K 7/08 |
| 2019/0256302 | A1 * | 8/2019 | Neubauer | H02K 7/08 |
| 2021/0159091 | A1 * | 5/2021 | Zhou | B60L 13/10 |
| 2021/0347390 | A1 * | 11/2021 | Klim | B60L 13/04 |
| 2022/0089196 | A1 * | 3/2022 | Deng | B60L 13/04 |

FOREIGN PATENT DOCUMENTS

| | | | |
|---|---|---|---|
| CN | 109270475 | A | 1/2019 |
| CN | 110763491 | A | 2/2020 |
| CN | 111505530 | A | 8/2020 |
| CN | 211689694 | U | 10/2020 |
| CN | 111942165 | A | 11/2020 |
| CN | 113447782 | A | 9/2021 |
| CN | 114643873 | A | 6/2022 |
| CN | 115326440 | A * | 11/2022 |
| CN | 116278785 | A | 6/2023 |
| JP | H03261302 | A | 11/1991 |
| JP | H04165902 | A | 6/1992 |
| JP | H05281281 | A | 10/1993 |
| JP | 2005304270 | A | 10/2005 |

OTHER PUBLICATIONS

Gao, Tao, et al. "Design of new energy-efficient permanent magnetic maglev vehicle suspension system." IEEE Access 7 (2019): 135917-135932. (Year: 2019).*

Luo Cheng et al., "Vertical stability of permanent magnet EDS system with novel Halbach array", Journal of Traffic and Transportation Engineering, Apr. 15, 2019, vol. 19, No. 2, pp. 101-109.

* cited by examiner

FAULT DETECTION DEVICE AND METHOD FOR SUPERCONDUCTING ELECTRODYNAMIC MAGNETIC LEVITATION (MAGLEV) TRACK

CROSS-REFERENCE TO RELATED APPLICATIONS

This application is a continuation of International Patent Application No. PCT/CN2024/094210, filed on May 20, 2024, which claims the benefit of priority from Chinese Patent Application No. 202310909901.1, filed on Jul. 24, 2023. The content of the aforementioned application, including any intervening amendments thereto, is incorporated herein by reference in its entirety.

TECHNICAL FIELD

This application relates to superconducting electrodynamic magnetic levitation (maglev), and more specifically to a fault detection device and method for a superconducting electrodynamic maglev track.

BACKGROUND

In a superconducting electrodynamic magnetic levitation (maglev) system, the figure-8-shaped coil is installed outside the propulsion coil, and is thus directly exposed to outdoor environmental factors, such as sunshine, wind and sand, rain and fog, and ice and snow. Therefore, the coil is prone to insulation deterioration or damage, and even open-circuit fault. However, the figure-8-shaped coil is responsible for levitation and guidance in the superconducting electrodynamic maglev system, and plays an important role in ensuring the stable operation of the maglev train. Therefore, it is necessary to perform fault diagnosis for the figure-8-shaped coil before the actual operation of the maglev train. In the existing technology, the geometric regularity detection and the magnetic field uniformity detection of the sidewall discrete figure-8-shaped coil track cannot be achieved. Therefore, it is urgent to develop a fault detection device for a superconducting electrodynamic maglev track to simultaneously detect the geometric regularity and magnetic field uniformity of the sidewall discrete figure-8-shaped coil track.

SUMMARY

An objective of the present disclosure is to provide a fault detection device and method for a superconducting electrodynamic maglev track to solve the above technical problems. The technical solutions of the present disclosure are described as follows.

In a first aspect, this application provides a fault detection device for a superconducting electric maglev track, comprising:

a frame system; and
a detection system;
wherein the frame system is provided between two sidewall discrete figure-8-shaped coil tracks; and a signal processing device is provided on a top of the frame system; and
two sides of the frame system are each provided with the detection system; the detection system comprises a lifting device and a clamping device; the lifting device is configured to adjust a vertical height of the clamping device; the clamping device is provided at an outer side of the lifting device; the clamping device is provided with a first connection portion and a second connection portion; the second connection portion is provided at an outer periphery of the first connection portion; the first connection portion is configured for connection with a permanent magnet array, and the second connection portion is configured for connection with a receiving coil; and the receiving coil is electrically connected to the signal processing device.

In a second aspect, this application provides a fault detection method for a superconducting electric maglev track, comprising:

setting a plurality of preset detection heights for the clamping device by means of the lifting device;
operating the frame system respectively at the plurality of preset detection heights, and collecting, by the signal processing device, a plurality of detection signals respectively corresponding to the plurality of preset detection heights;
performing a magnetic field uniformity analysis based on the plurality of detection signals; and
performing a fault point analysis on the sidewall discrete figure-8-shaped coil tracks based on the plurality of detection signals.

The beneficial effects of the present disclosure are described as follows.

Regarding the fault detection device provided herein, the magnetic field generated by the permanent magnet array is applied to the discrete figure-8-shaped coil track, and the coil at the periphery of the permanent magnet array is used as a receiving coil to capture the induced magnetic field generated by the induced current of the discrete figure-8-shaped coil. In addition, the receiving coil is connected to a series of signal processing devices, such as a filtering circuit, an amplifying circuit and an oscilloscope, for extracting and displaying the received electrical signals, thus realizing the non-contact detection of geometrical regularity and magnetic field uniformity of the discrete figure-8-shaped coil track.

Other features and advantages of the present disclosure will be set forth below, parts of which will be apparent from the specification or understood by implementing embodiments of the present disclosure. The objects and other advantages of the present disclosure may be realized and obtained from the specification, the claims and the particularly-indicated structure in the drawings.

BRIEF DESCRIPTION OF THE DRAWINGS

To more clearly illustrate the technical solutions of the embodiments of the present application, the accompanying drawings needed in the description of embodiments will be briefly introduced below. It should be understood that the following accompanying drawings merely show some embodiments of the present application, and therefore should not be construed as limitation to the scope of the present disclosure. Other related drawings can be obtained by one of ordinary skill in the art based on the accompanying drawings without making any creative effort.

Figure 8:
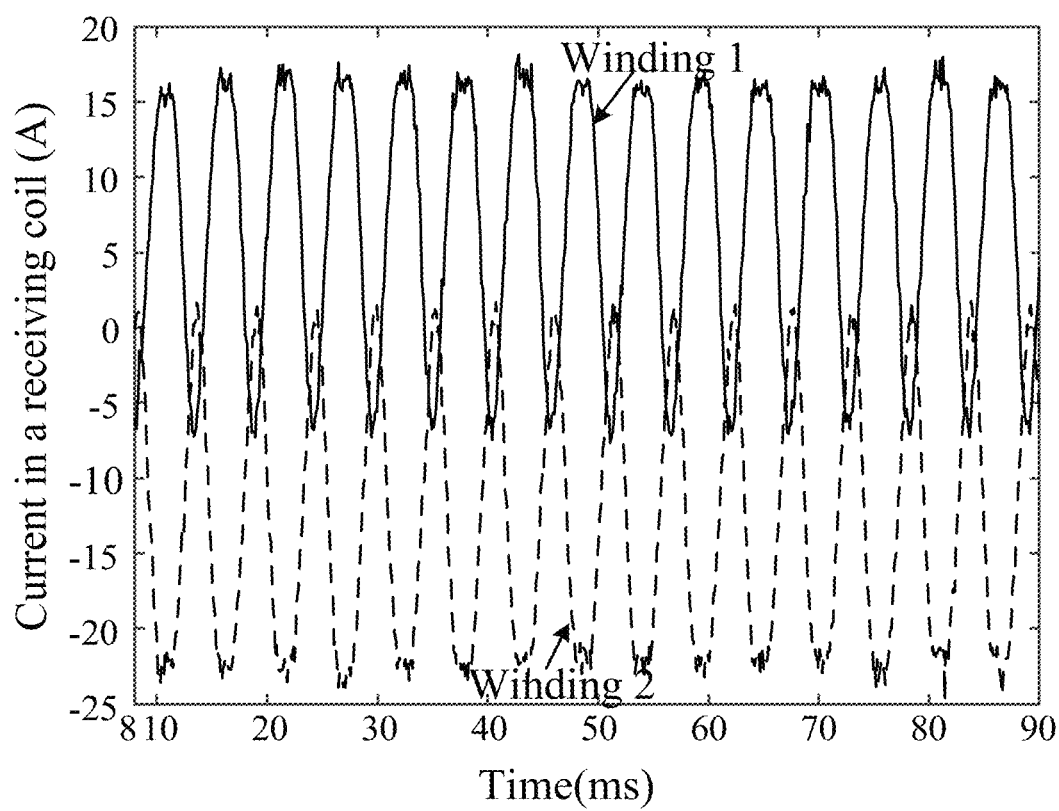
FIG. 8 shows a current change curve of a receiving coil when the figure-8-shaped coil does not fail under finite element simulation.

In the drawings, 1, frame system; 11, vehicle body; 12, bogie; 13, wheel; 14, alternating-current (AC) generator; 131, hub motor; 21, lifting device; 22, clamping device; 23, permanent magnet array; 24, receiving coil; 211, mounting plate; 212, electric push rod; 221, first connection portion; 222, second connection portion; 231, first main magnetic pole; 232, second main magnetic pole; 2211, mounting substrate; 2222, slot; 3, sidewall discrete figure-8-shaped coil track.

DETAILED DESCRIPTION OF EMBODIMENTS

To make the purpose, technical solutions and advantages of the embodiments of the present application clearer, the technical solutions in the embodiments of the present application will be described clearly and completely below with reference to the accompanying drawings. Obviously, described herein are merely some embodiments of the present application, rather than all embodiments. The components of embodiments of the present application generally described and illustrated in the accompanying drawings herein may be arranged and designed in a variety of different configurations. Accordingly, the following detailed description is not intended to limit the scope of the present application, but rather represents selected embodiments of the present application. Based on the embodiments of the present application, all other embodiments obtained by one of ordinary skill in the art without making creative effort shall fall within the scope of the present application.

It should be noted that similar symbols and letters denote similar items in the following drawings. Therefore, once an item has been defined in one drawing, there is no need to further define or explain such item in the subsequent drawings. Furthermore, the terms "first", "second", and "third" are merely for distinguishment, and should not be understood as indicating or implying relative importance.

Embodiment 1

Provided herein is a fault detection device for a superconducting electrodynamic maglev track.

Figure 1:
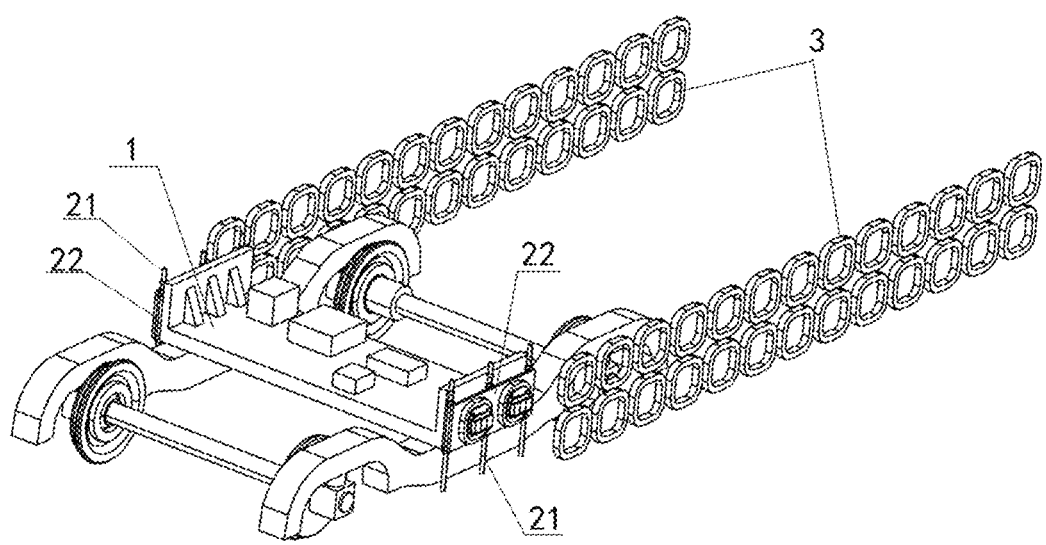
FIG. 1 structurally depicts a fault detection device for a superconducting electrodynamic maglev track according to an embodiment of the present disclosure.
Figure 2:
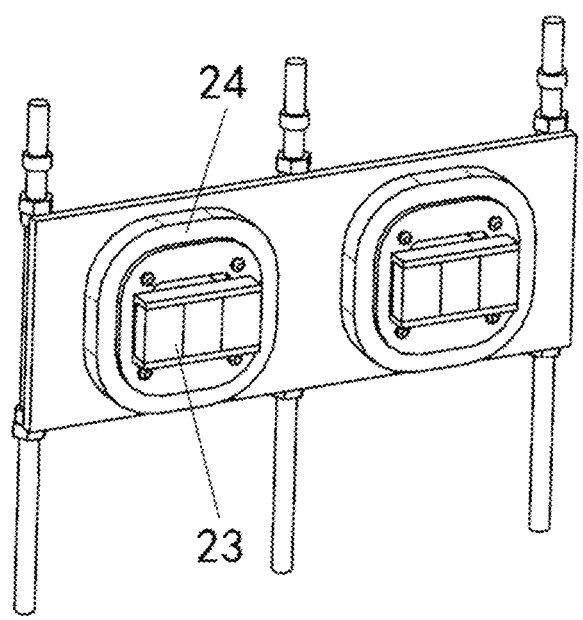
FIG. 2 schematically shows installation of a permanent magnet array and a receiving coil according to an embodiment of the present disclosure.

As shown in FIGS. 1 and 2, the fault detection device includes a frame system 1 and a detection system.

The frame system 1 is provided between two sidewall discrete figure-8-shaped coil tracks 3, and a signal processing device is provided on a top of the frame system 1.

Two sides of the frame system 1 are each provided with the detection system. The detection system includes a lifting device 21 and a clamping device 22. The lifting device 21 is configured to adjust a vertical height of the clamping device 22, and the clamping device 22 is provided at an outer side of the lifting device 21.

Figure 5:
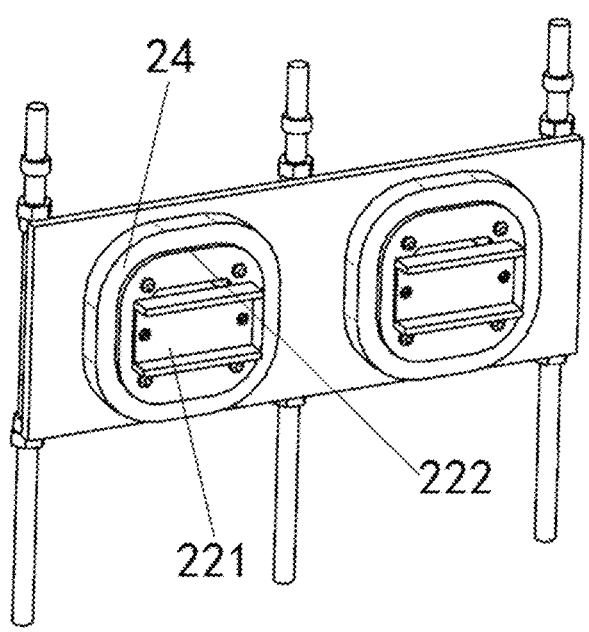
FIG. 5 is a schematic diagram of a first connection portion and a second connection portion according to an embodiment of the present disclosure.

As shown in FIG. 5, the clamping device 22 is provided with a first connection portion 221 and a second connection portion 222. The second connection portion 222 is provided at an outer periphery of the first connection portion 221. The first connection portion 221 is configured for connection with a permanent magnet array 23, and the second connection portion 222 is configured for connection with a receiving coil 24. The receiving coil 24 is electrically connected to the signal processing device.

In the detection device provided herein, the single-sided magnetism of the permanent magnet array 23 is utilized to generate a source magnetic field. When the detection is performed, the source magnetic field is interlinked with a figure-8-shaped coil in the sidewall discrete figure-8-shaped coil track 3 to induce an electric potential within the figure-8-shaped coil. When the figure-8-shaped coil is undamaged, an induced current is generated within the figure-8-shaped coil, which then generates a magnetic field around the figure-8-shaped coil. When the receiving coil 24 is provided at the outer periphery of the permanent magnet array 23, the single-sided magnetism of the permanent magnet array 23 can reduce the influence of the source magnetic field on the receiving coil 24, and the receiving coil 24 induces an electric potential inside by capturing the magnetic field generated by the figure-8-shaped coil. After that, the electric signals within the receiving coil 24 are processed by the signal processing device through filtering, amplifying and displaying to obtain electric signal waveforms reflecting geometrical smoothness and magnetic field uniformity of the figure-8-shaped coil, so as to realize the real-time observation.

In the present disclosure, to ensure the generation of a good source magnetic field, the permanent magnet array 23 includes two Halbach permanent magnets disposed side by side, and each of the two Halbach permanent magnet arrays has at least two different predetermined magnetization acute angles, where a 90° magnetization angle is preset between the at least two different predetermined magnetization acute angles. The Halbach permanent magnet array used herein is an emitter.

Figure 3:
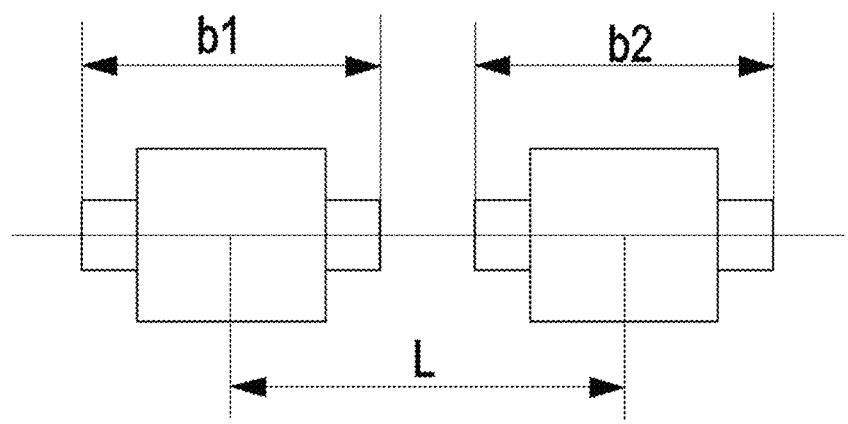
FIG. 3 schematically shows a first width, a second width and a target polar distance according to an embodiment of the present disclosure.

The effect of the width of the permanent magnet array 23 on detection results will be clarified with reference to FIG. 3. The two Halbach permanent magnets of the permanent magnet array 23 are respectively a first Halbach permanent magnet and a second Halbach permanent magnet, and each of the first Halbach permanent magnet and the second Halbach permanent magnet is a cross-shaped permanent magnet. A width of the first Halbach permanent magnet is defined as a first width, and a width of the second Halbach permanent magnet is defined as a second width. A first main magnetic pole 231 is provided in the first Halbach permanent magnet, and a second main magnetic pole 232 is provided in the second Halbach permanent magnet. A horizontal distance from a center of the first main magnetic pole 231 to a center of the second main magnetic pole 232 is defined as a target polar distance. The target polar distance, the first width and the second width are controlled by means of a predetermined polar distance model.

In the detection device, the predetermined polar distance model is expressed by:

$$\begin{cases} b_1 = k_1 \times L \\ b_2 = k_2 \times L \end{cases};$$

where $b_1$ represents the first width; $k_1$ represents a first predetermined polar arc coefficient; L represents the target polar distance; $b_2$ represents the second width; and $k_2$ represents a second predetermined polar arc coefficient.

Further, to clarify the setting of the width of a single Halbach permanent magnet in the present device, the first Halbach permanent magnet includes a first boundary magnetic pole, a second boundary magnetic pole and a first main magnetic pole 231. The first main magnetic pole 231 is provided between the first boundary magnetic pole and the second boundary magnetic pole. A width of the first boundary magnetic pole is equal to that of the second boundary magnetic pole, and a width of the first main magnetic pole 231 is larger than that of the first boundary magnetic pole.

The second Halbach permanent magnet includes a third boundary magnetic pole, a fourth boundary magnetic pole and the second main magnetic pole 232. The second main magnetic pole 232 is provided between the third boundary magnetic pole and the fourth boundary magnetic pole. A width of the third boundary magnetic pole is equal to that of the fourth boundary magnetic pole, and a width of the second main magnetic pole 232 is larger than that of the third boundary magnetic pole.

Figure 4:
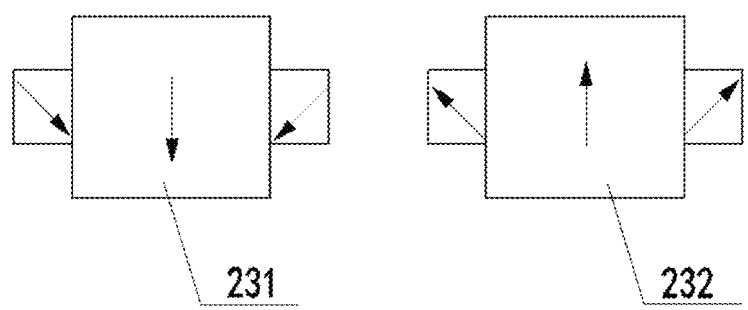
FIG. 4 schematically shows a predetermined magnetization acute angle according to an embodiment of the present disclosure.

As shown in FIG. 4, to clarify the specific setting of the predetermined magnetization acute angle, the Halbach permanent magnet array includes a first predetermined magnetization acute angle and a second predetermined magnetization acute angle. When the first predetermined magnetization acute angle is equal to the second predetermined magnetization acute angle, the source magnetic field will be more stable and uniform.

Figure 6:
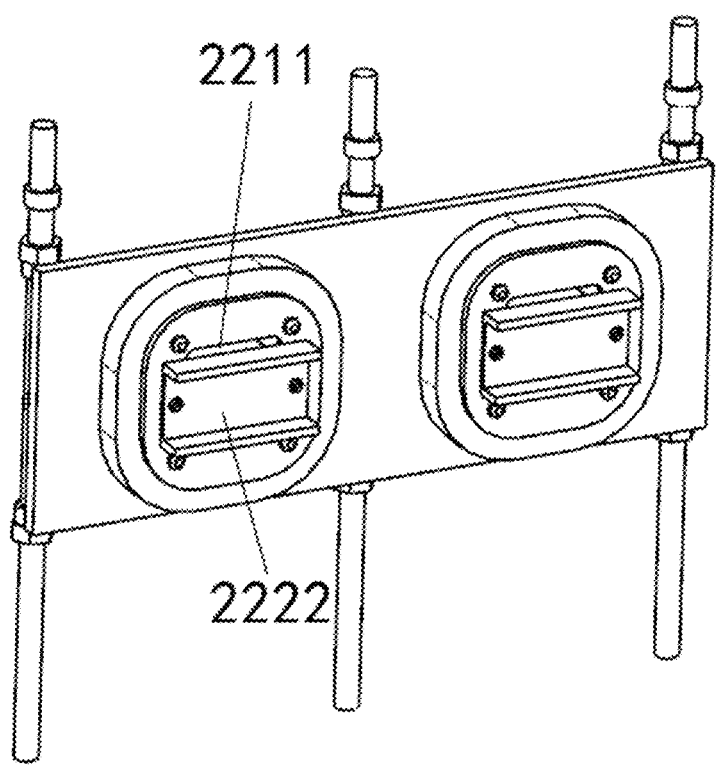
FIG. 6 is a schematic diagram of a mounting substrate and a slot on the first connection portion according to an embodiment of the present disclosure.

As shown in FIG. 6, to clarify the specific structure of the first connection portion 221 and the second connection portion 222, the first connection portion 221 includes a mounting substrate 2211. The mounting substrate 2211 is provided with a slot 2222, and the permanent magnet array 23 is fixedly connected in the slot 2222.

The second connection portion 222 is a mounting base. The receiving coil 24 is sleevedly provided on an outer wall of the mounting base. The mounting substrate 2211 is arranged at a center of the mounting base 222, and a center of gravity of the mounting substrate 2211 coincides with that of the mounting base 222.

When the mounting substrate 2211 is provided in the center of the mounting base 222, and the center of gravity of the mounting substrate 2211 coincides with the center of gravity of the mounting base 222, the position of the permanent magnet array 23 relative to the receiving coil 24 remains fixed, which can effectively ensure the electromagnetic effects between the permanent magnet array 23, the receiving coil 24 and the figure-8-shaped coil.

Figure 7:
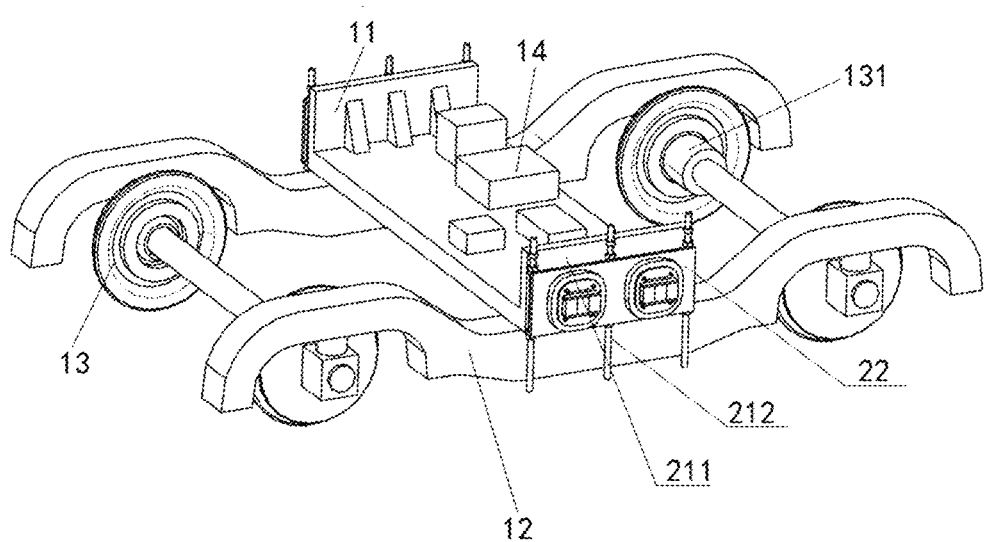
FIG. 7 is a schematic diagram of a frame system according to an embodiment of the present disclosure.

As shown in FIG. 7, in the present detection device, to clarify the specific structure of the frame system 1, the frame system 1 includes a vehicle body 11, a bogie 12, a wheel 13 and an alternating-current (AC) generator 14. The vehicle body 11 is provided at a top of the bogie 12. The wheel 13 cooperates with a bottom of the bogie 12. The wheel 13 is provided with a hub motor 131, and the hub motor 131 is electrically connected to the AC generator 14.

In the present detection device, the bogie 12 is configured to support and guide the vehicle body 11. When an on-board battery is introduced to provide direct current for the present device, a traction inverter device is required to realize the supply of alternating current, so as to drive the frame system 1.

In the present device, to clarify the specific structure of the signal processing device, the signal processing device includes a filter amplifier and an oscilloscope. The filter amplifier, the oscilloscope and the receiving coil 24 are electrically connected. The signal processing device is configured to filter, amplify and display received electrical signals, so as to realize the electrical signal feedback for the geometrical smoothness and the magnetic field uniformity of the discrete figure-8-shaped coil track.

In the present device, to enable the lifting device 21 to accurately reach a plurality of preset detection heights and to facilitate the adjustment of the preset detection heights, the lifting device 21 includes a mounting plate 211 and an electric push rod 212. One end of the mounting plate 211 is fixedly connected to a side of the frame system 1, and the other end of the mounting plate 211 is fixedly connected to the electric push rod 212. The electric push rod 212 is provided with an output end, and the output end is in transmission connection with the clamping device 22.

Embodiment 2

Provided herein a fault detection method for a superconducting electric maglev track, which includes the following steps.

A plurality of preset detection heights are set for a clamping device 22 by means of a lifting device 21.

A frame system 1 is operated respectively at the plurality of preset detection heights. A plurality of detection signals respectively corresponding to the plurality of preset detection heights are collected by a signal processing device.

A magnetic field uniformity analysis is performed based on the plurality of detection signals.

A fault point detection analysis is performed on the sidewall discrete figure-8-shaped coil tracks 3 based on the plurality of detection signals.

The magnetic field uniformity analysis is performed based on the plurality of detection signals through the following steps.

When a signal processing device includes a filter amplifier and an oscilloscope, and the filter amplifier, the oscilloscope and a receiving coil 24 are electrically connected, oscilloscope waveforms respectively corresponding to the plurality of detection signals are collected in real time during the traveling of the frame system 1. When the oscilloscope waveform fluctuates up and down at a certain value presenting a periodical change without a sudden change, it means that the figure-8-shaped coil track is geometrically uniformly arranged with a uniform magnetic field.

When the waveform undergoes a sudden change at a certain moment and returns to the previous value after another preset detection moment, it indicates that there is a fault (broken or short circuit) at the figure-8-shaped coil corresponding to the moment where the sudden change of the waveform occurs. The preset detection moment is the electromagnetic induction time of a figure-8-shaped coil and a set of permanent magnet array 23.

The fault point analysis is performed on the sidewall discrete figure-8-shaped coil tracks 3 based on the plurality of detection signals through the following steps.

The judgment basis of the coil fault is obtained by means of finite element simulation. Specifically, in an Ansys software, to establish a three-dimensional (3D) finite element model containing a permanent magnet array 23, a receiving coil 24 and a sidewall discrete figure-8-shaped coil track 3. The simulation type is set as a transient magnetic field. Centers of a permanent magnet array 23, a receiving coil 24 and a sidewall discrete figure-8-shaped coil track 3 are aligned. A motion domain is set for the region where the permanent magnet array 23 and the receiving coil 24 are located, with a move direction along the longitudinal direction of the sidewall discrete figure-8-shaped coil track 3 at a speed of 60 km/h (uniform speed), so that the change curve of the induced current in the receiving coils Winding1 and Winding2 with the running time can be obtained.

Figure 9:
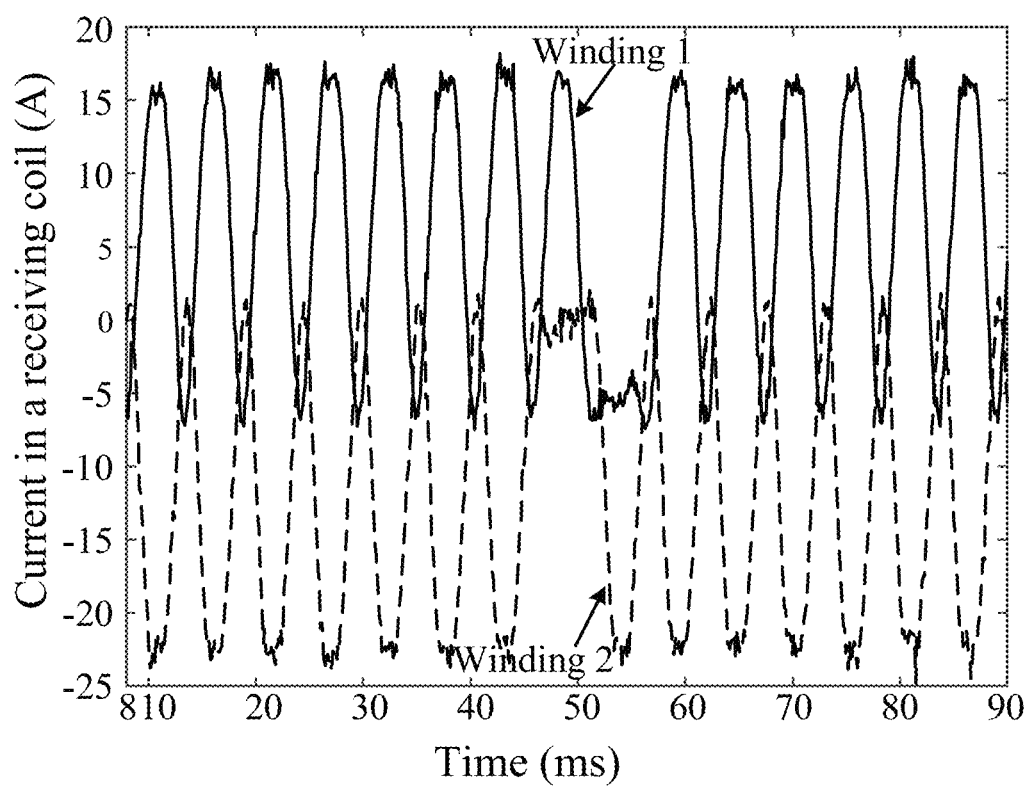
FIG. 9 shows a current change curve of the receiving coil when the figure-8-shaped coil fails under the finite element simulation.

FIG. 8 is a curve showing a current change of the receiving coil when the figure-8-shaped coil is not failed under finite element simulation. FIG. 9 is a curve showing a current change of a receiving coil when the figure-8-shaped coil is failed under the finite element simulation. As can be seen from FIG. 8 and FIG. 9, when a coil in the figure-8-shaped coils of the sidewall discrete figure-8-shaped coil track 3 is disconnected, the current change in the receiving coil is more pronounced compared with the situation when the coil has not failed.

Figure 10:
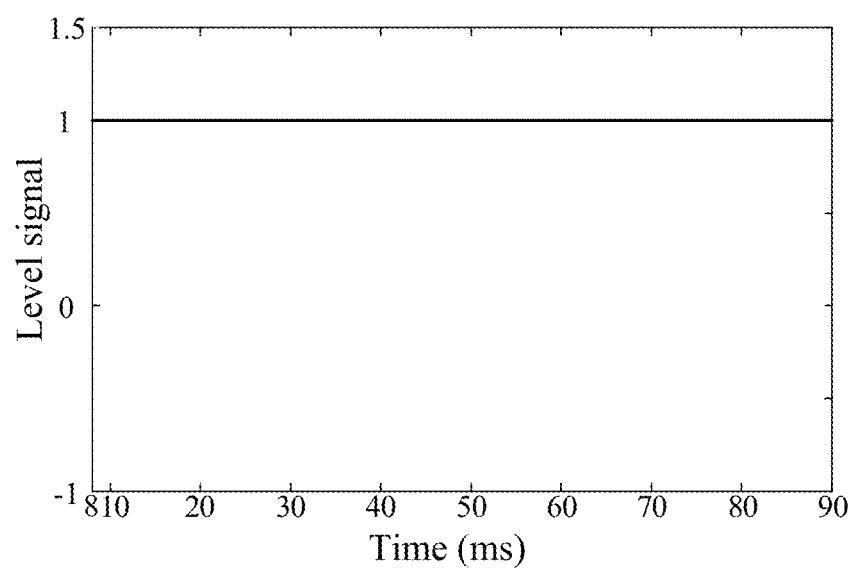
FIG. 10 shows a level signal when the figure-8-shaped coil does not fail.
Figure 11:
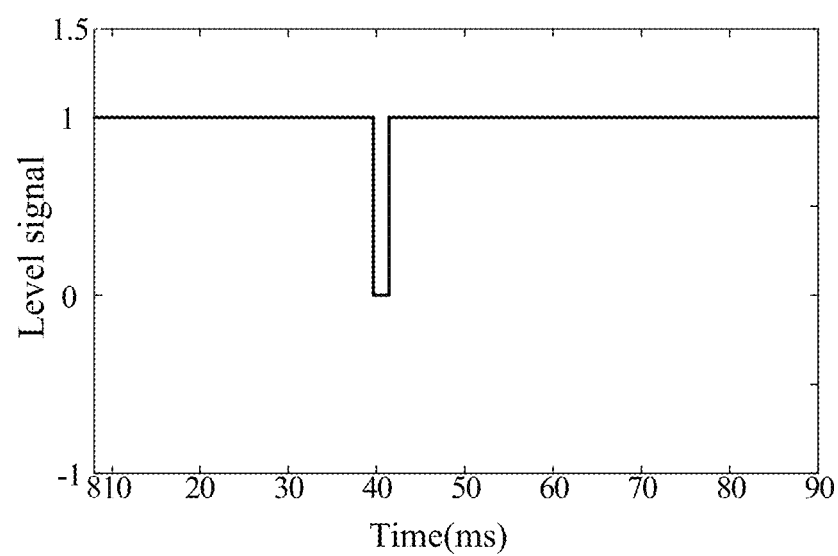
FIG. 11 shows a level signal when the figure-8-shaped coil fails.

To further realize the precise positioning of the fault point of the figure-8-shaped coil for facilitating the overhaul, the current signals in Winding1 and Winding2 are compared. As shown in FIG. 10, when the sidewall figure-8-shaped coil has no fault points, the comparison result of the electrical signal of the receiving coil is 1. As shown in FIG. 11, when the sidewall figure-8-shaped coil has a fault point, the comparison result of the electrical signal of the receiving coil appears to be a process of change from 1 to 0 and back to 1. According to the difference in output level in these two cases, a logic circuit is used to render a warning lamp non-luminous at a high level of 1 and luminous at a low level of 0. In other words, when the electrical signal of the receiving coil is abnormal, the warning lamp in the post-processing will light up to facilitate the locating of the fault point of the figure-8-shaped coil. Thereby, the present detection method analyzes the fault point of the sidewall discrete figure-8-shaped coil track 3 based on the different detection signals.

Further, an external filtering and amplifying circuit built by Matlab/Simulink may also be used to filter and amplify the electrical signals of the receiving coil to obtain the filtered and amplified signals.

Figure 12:
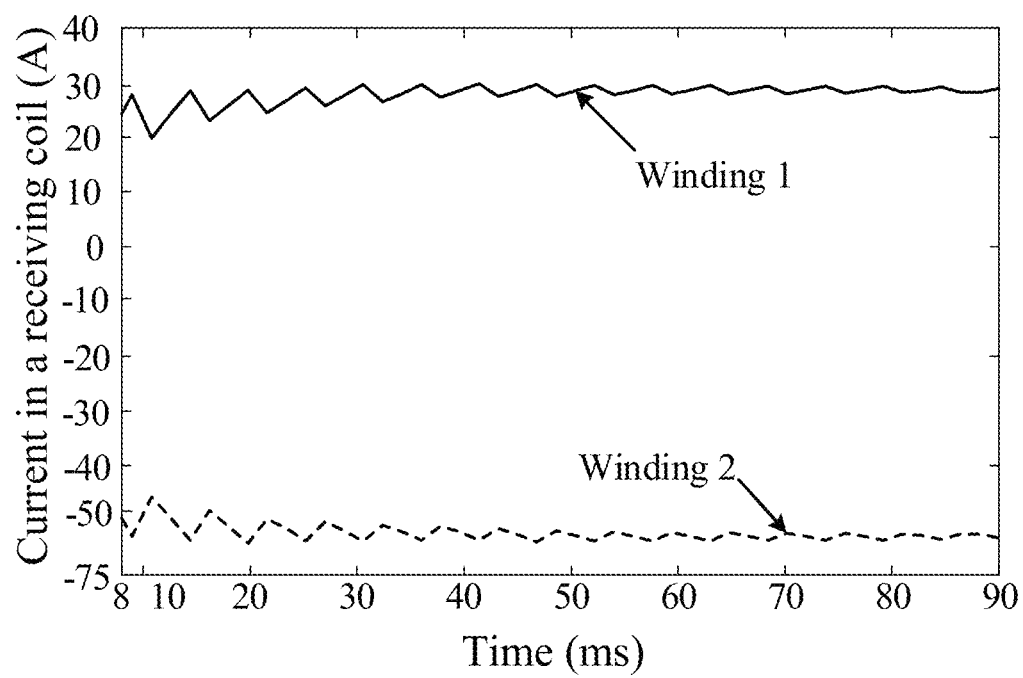
FIG. 12 shows a current signal curve displayed on an oscilloscope when the figure-8-shaped coil does not fail.

As shown in FIG. 12, the received signal waveform is stable without the disconnection of the figure-8-shaped coil.

Figure 13:
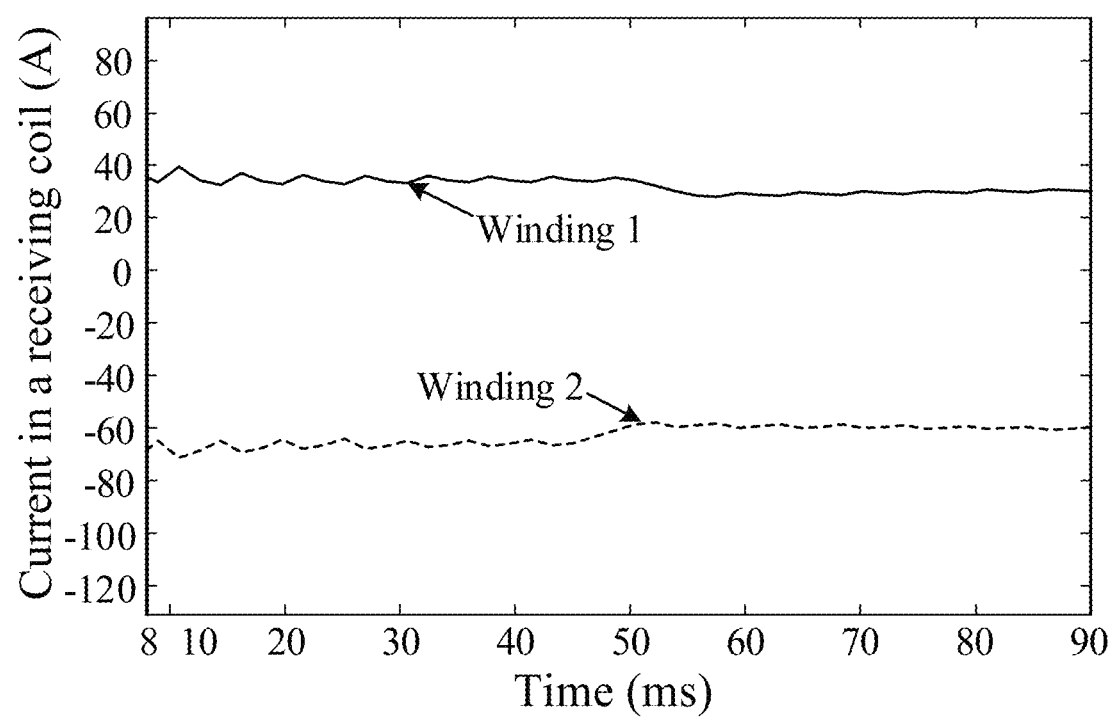
FIG. 13 shows a current signal curve displayed on the oscilloscope when the figure-8-shaped coil fails.

As shown in FIG. 13, when there is a break in one of the figure-8-shaped coils, the received electrical signal fluctuates steadily at a certain current value before the frame system 1 reaches the failed figure-8-shaped coil, but when the frame system 1 passes the failed figure-8-shaped coil, the received electrical signal jumps to another current value. From this, it can be determined that the sidewall discrete figure-8-shaped coil track has a fault point.

Described above are merely specific embodiments of the present disclosure, but the scope of the present disclosure is not limited thereto. It should be understood that various changes, modifications or substitutions made by one of ordinary skill in the art without departing from the scope of the present disclosure shall be included in the scope of present disclosure defined by the appended claims.

What is claimed is:
1. A fault detection device for a superconducting electrodynamic magnetic levitation (maglev) track, comprising:
a frame system; and
a detection system;
wherein the frame system is provided between two sidewall discrete figure-8-shaped coil tracks; and a signal processing device is provided on a top of the frame system;
two sides of the frame system are each provided with the detection system; the detection system comprises a lifting device and a clamping device; the lifting device is configured to adjust a vertical height of the clamping device; the clamping device is provided at an outer side of the lifting device; the clamping device is provided with a first connection portion and a second connection portion; the second connection portion is provided at an outer periphery of the first connection portion; the first connection portion is configured for connection with a permanent magnet array, and the second connection portion is configured for connection with a receiving coil; and the receiving coil is electrically connected to the signal processing device;
the permanent magnet array comprises a first Halbach permanent magnet and a second Halbach permanent magnet disposed side by side, and each of the first Halbach permanent magnet and the second Halbach permanent magnet has at least two predetermined magnetization acute angles different from each other, wherein a 90° magnetization angle is preset between the at least two predetermined magnetization acute angles;
each of the first Halbach permanent magnet and the second Halbach permanent magnet is cross-shaped; a width of the first Halbach permanent magnet is defined as a first width, and a width of the second Halbach permanent magnet is defined as a second width; a first main magnetic pole is provided in the first Halbach permanent magnet, and a second main magnetic pole is provided in the second Halbach permanent magnet; a horizontal distance from a center of the first main magnetic pole to a center of the second main magnetic pole is a defined as a target polar distance; the target polar distance, the first width and the second width are adapted to be controlled by means of a predetermined polar distance model; the predetermined polar distance model is expressed by:

$$\begin{cases} b_1 = k_1 \times L \\ b_2 = k_2 \times L \end{cases};$$

wherein $b_1$ represents the first width; $k_1$ represents a first predetermined polar arc coefficient; L represents the target polar distance; $b_2$ represents the second width; and $k_2$ represents a second predetermined polar arc coefficient;
the first connection portion comprises a mounting substrate; the mounting substrate is provided with a slot; and the permanent magnet array is fixedly connected in the slot; and
the second connection portion is a mounting base; the receiving coil is sleevedly provided on an outer wall of the mounting base; the mounting substrate is arranged at a center of the mounting base, and a center of gravity of the mounting substrate is configured to be coincided with that of the mounting base; and a position of the permanent magnet array relative to the receiving coil is fixed.

2. The fault detection device of claim 1, wherein the at least two predetermined magnetization acute angles comprise a first predetermined magnetization acute angle and a second predetermined magnetization acute angle; and the first predetermined magnetization acute angle is equal to the second predetermined magnetization acute angle.

3. The fault detection device of claim 1, wherein the first Halbach permanent magnet comprises a first boundary magnetic pole, a second boundary magnetic pole and the first main magnetic pole; the first main magnetic pole is provided between the first boundary magnetic pole and the second boundary magnetic pole; a width of the first boundary magnetic pole is equal to that of the second boundary magnetic pole, and a width of the first main magnetic pole is larger than that of the first boundary magnetic pole;

the second Halbach permanent magnet comprises a third boundary magnetic pole, a fourth boundary magnetic pole and the second main magnetic pole; the second main magnetic pole is provided between the third boundary magnetic pole and the fourth boundary magnetic pole; and a width of the third boundary magnetic pole is equal to that of the fourth boundary magnetic pole, and a width of the second main magnetic pole is larger than that of the third boundary magnetic pole.

4. The fault detection device of claim 1, wherein the frame system comprises a vehicle body, a bogie, a wheel and an alternating-current (AC) generator; the vehicle body is provided at a top of the bogie; the wheel is configured to cooperate with a bottom of the bogie; and the wheel is provided with a hub motor, and the hub motor is electrically connected to the AC generator.

5. The fault detection device of claim 1, wherein the signal processing device comprises a filter amplifier and an oscilloscope; and the filter amplifier, the oscilloscope and the receiving coil are electrically connected.

6. The fault detection device of claim 1, wherein the lifting device comprises a mounting plate and an electric push rod; a first end of the mounting plate is fixedly connected to a side of the frame system, and a second end of the mounting plate is fixedly connected to the electric push rod; and the electric push rod is provided with an output end, and the output end is in transmission connection with the clamping device.

7. A fault detection method for a superconducting electrodynamic maglev track using the fault detection device of claim 1, comprising:
setting a plurality of preset detection heights for the clamping device by means of the lifting device;
operating the frame system respectively at the plurality of preset detection heights, and collecting, by the signal processing device, a plurality of detection signals respectively corresponding to the plurality of preset detection heights;
performing a magnetic field uniformity analysis based on the plurality of detection signals; and
performing a fault point analysis on the sidewall discrete figure-8-shaped coil tracks based on the plurality of detection signals.

\* \* \* \* \*